United States Patent
Jang et al.

(10) Patent No.: US 11,107,927 B2
(45) Date of Patent: Aug. 31, 2021

(54) OXIDE SEMICONDUCTOR TRANSISTOR HAVING DUAL GATE STRUCTURE AND METHOD OF FABRICATING THE SAME

(71) Applicant: UNIVERSITY-INDUSTRY COOPERATION GROUP OF KYUNG HEE UNIVERSITY, Yongin-si (KR)

(72) Inventors: Jin Jang, Seoul (KR); Tae Hun Kim, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 16/347,045

(22) PCT Filed: Sep. 13, 2017

(86) PCT No.: PCT/KR2017/010038
§ 371 (c)(1),
(2) Date: May 2, 2019

(87) PCT Pub. No.: WO2018/084421
PCT Pub. Date: May 11, 2018

(65) Prior Publication Data
US 2020/0075767 A1    Mar. 5, 2020

(30) Foreign Application Priority Data
Nov. 2, 2016 (KR) .......... 10-2016-0145338

(51) Int. Cl.
*H01L 29/786* (2006.01)
*H01L 29/51* (2006.01)
(Continued)

(52) U.S. Cl.
CPC ........ *H01L 29/7869* (2013.01); *H01L 29/517* (2013.01); *H01L 29/66969* (2013.01); *H01L 29/78648* (2013.01); *H01L 27/1225* (2013.01)

(58) Field of Classification Search
CPC .......... H01L 29/78645; H01L 27/3248; H01L 29/78669
See application file for complete search history.

(56) References Cited

U.S. PATENT DOCUMENTS 9,117,920 B2    8/2015  Koezuka et al.
2005/0275038 A1*  12/2005  Shih .................. H01L 29/78633
                                                                            257/382
(Continued)

FOREIGN PATENT DOCUMENTS

JP        6006975 B2    10/2016
KR    10-0205868 B1     7/1999
(Continued)

OTHER PUBLICATIONS

Youn Goo Kim et al., "Stable and High-Performance Indium Oxide Thin-Film Transistor by Ga Doping", IEEE Transactions on Electron Devices, Mar. 2016, 7 pages, vol. 63, No. 3.
(Continued)

*Primary Examiner* — Dale E Page
*Assistant Examiner* — Wilner Jean Baptiste
(74) *Attorney, Agent, or Firm* — Sughrue Mion, PLLC

(57) ABSTRACT

The present invention disclosures an oxide semiconductor transistor and a method of fabricating the same. The oxide semiconductor transistor according to an embodiment of the present invention includes a first gate electrode formed on a substrate; a first gate insulating film formed using a solution process on the first gate electrode; a source electrode and a drain electrode separately formed on one surface of the first gate insulating film; an oxide semiconductor film formed
(Continued)

using a solution process on the first gate insulating film and the source and drain electrodes; a second gate insulating film formed using a solution process on the oxide semiconductor film; pixel electrodes separately formed on one surface of the second gate insulating film and electrically connected to the source and drain electrodes, respectively; and a second gate electrode formed on the second gate insulating film. According to the present invention, the first and second gate insulating films and the oxide semiconductor film are formed using a solution process, and an offset present between the source electrode and the second gate electrode and an offset present between the drain electrode and the second gate electrode are each adjusted to be 1 μm or more to reduce drain current, thereby stabilizing the electrical properties of the oxide semiconductor transistor.

7 Claims, 28 Drawing Sheets

(51) Int. Cl.
*H01L 29/66* (2006.01)
*H01L 27/12* (2006.01)

(56) References Cited

U.S. PATENT DOCUMENTS

| | | | |
|---|---|---|---|
| 2015/0340413 A1* | 11/2015 | Lee | H01L 51/5209 257/40 |
| 2016/0141390 A1* | 5/2016 | Kao | H01L 29/4908 349/46 |

FOREIGN PATENT DOCUMENTS

| | | |
|---|---|---|
| KR | 10-0931587 B1 | 12/2009 |
| KR | 10-1108176 B1 | 1/2012 |
| KR | 10-2012-0065048 A | 6/2012 |
| KR | 10-2013-0099693 A | 9/2013 |
| KR | 10-1381549 B1 | 4/2014 |
| KR | 10-1506098 B1 | 3/2015 |
| KR | 10-2015-0076936 A | 7/2015 |

OTHER PUBLICATIONS

Mohammad Masum Billah et al., "TCAD Simulation of Dual-Gate a-IGZO TFTs With Source and Drain Offsets", IEEE Electron Device Letters, Nov. 2016, 4 pages, vol. 27, No. 11.

Chang Hoon Jeon et al., "Fast Threshold Voltage Compensation AMOLED Pixel Circuit Using Secondary Gate Effect of Dual Gate a-IGZO TFTs", IEEE Electron Device Letters, Nov. 2016, 4 pages, vol. 37, No. 11.

Ravindra Naik Bukke et al., "Improvement in performance of solution processed indium-zinc-tin oxide thin film transistors by using OV Ozone treatment on zirconium oxide gate insulator", AM-FPD'15, 2 pages.

Young-Je Cho et al., "Evaluation of $Y_2O_3$ gate insulators for a-IGZO thin film transistors", Thin Solid Films, 2009, pp. 4115-4118, vol. 517.

Korean Office Action for KR10-2016-0145338 dated Dec. 27, 2017.
International Search Report for PCT/KR2017/010038 dated Dec. 14, 2017 [PCT/ISA/210].

* cited by examiner

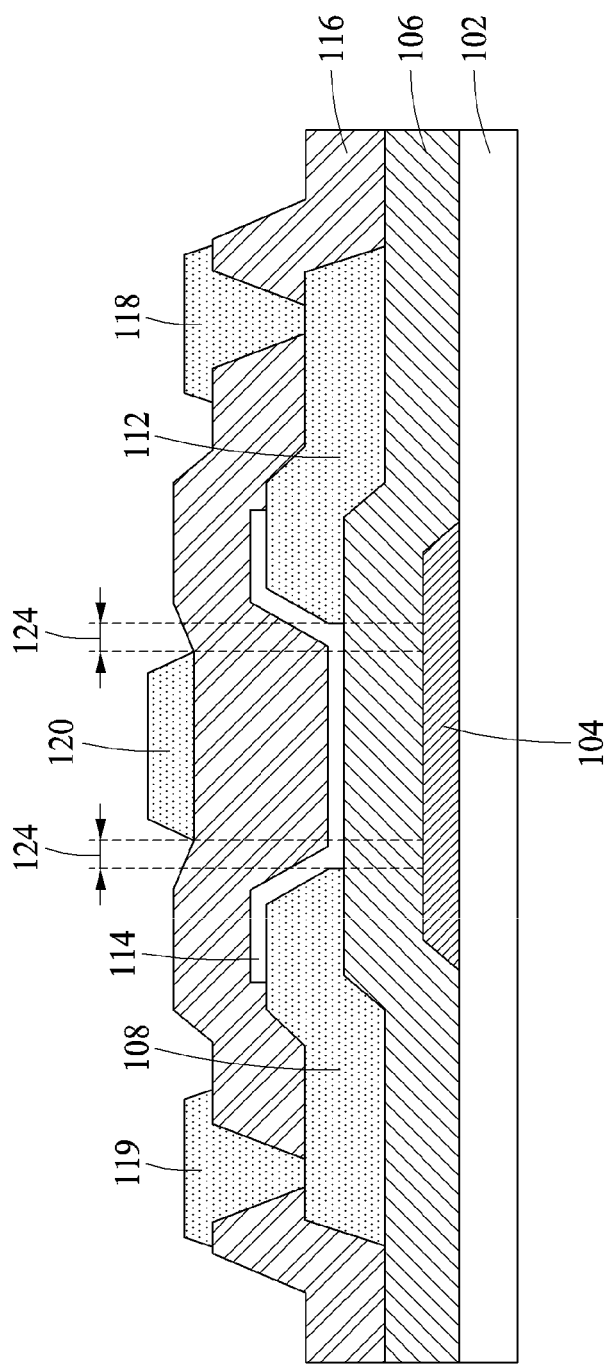
[FIG. 1]

[FIG. 2]
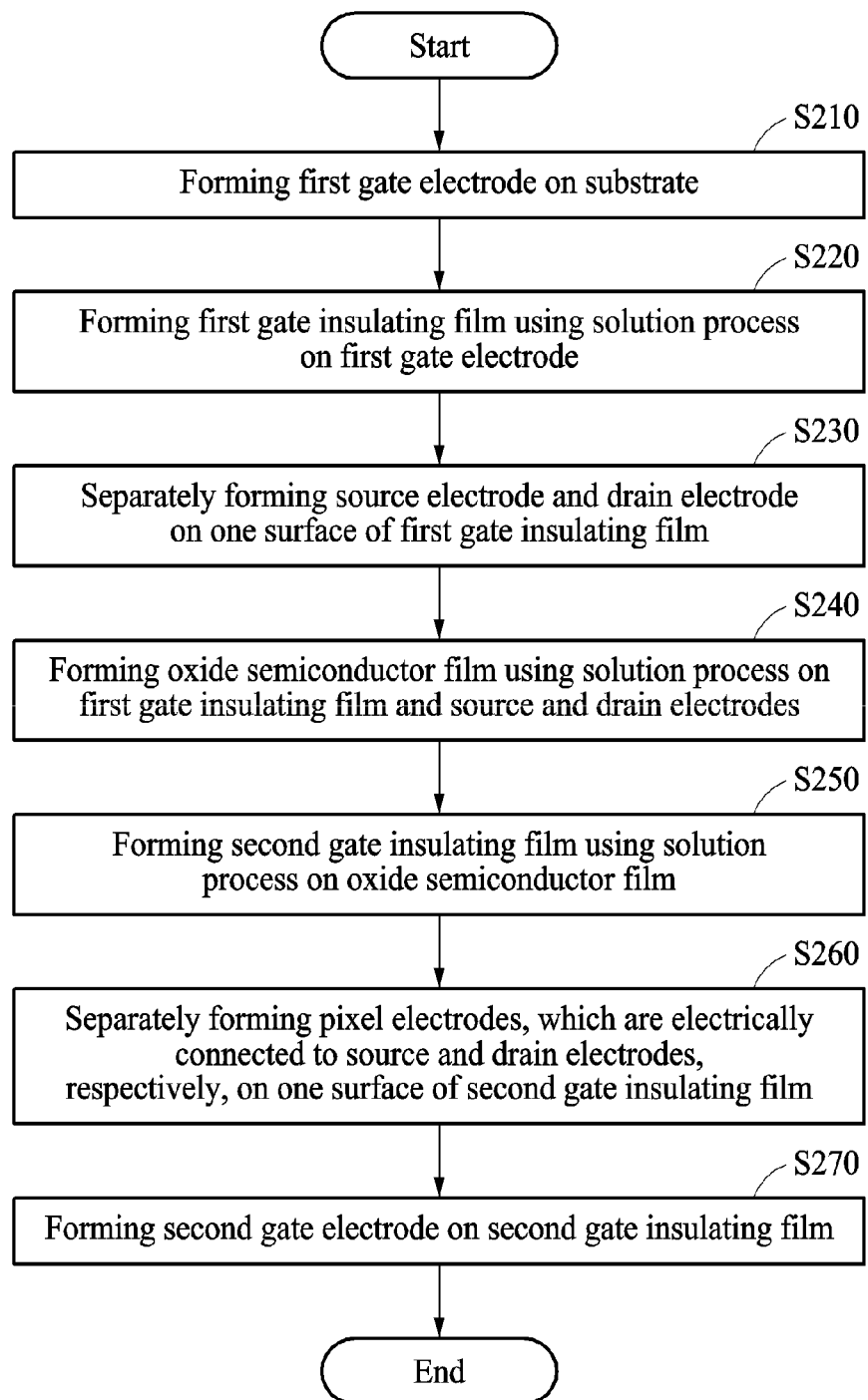

[FIG. 3A]
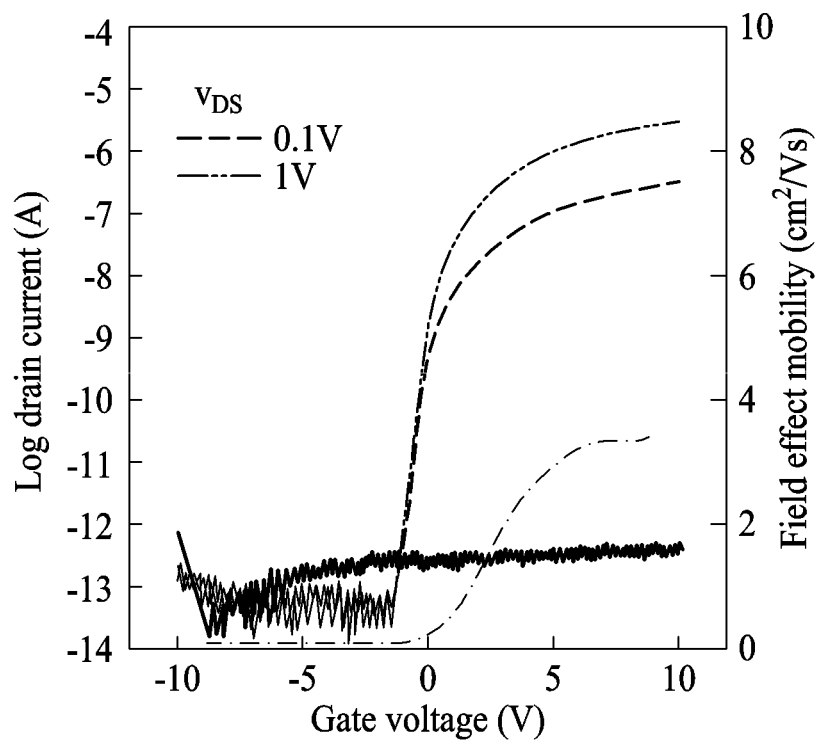

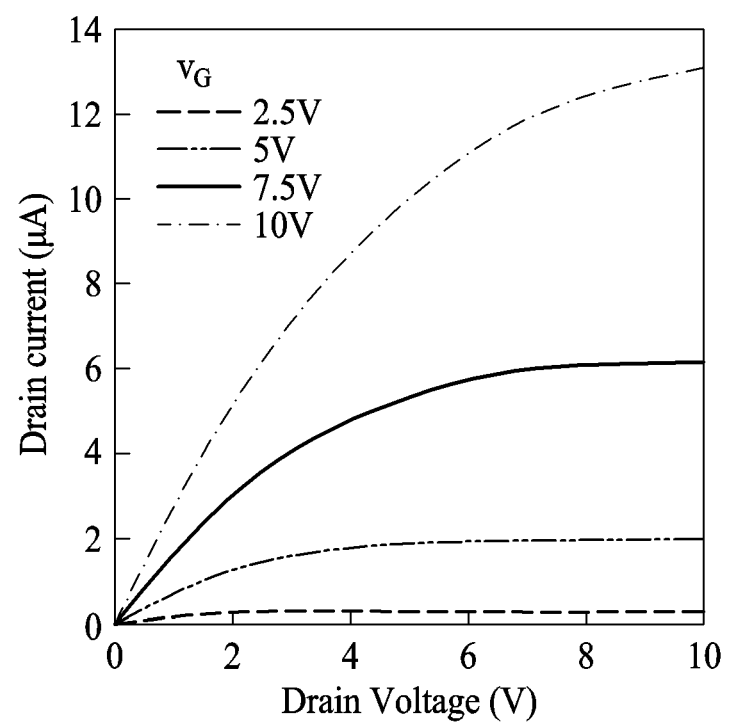

[FIG. 4A]
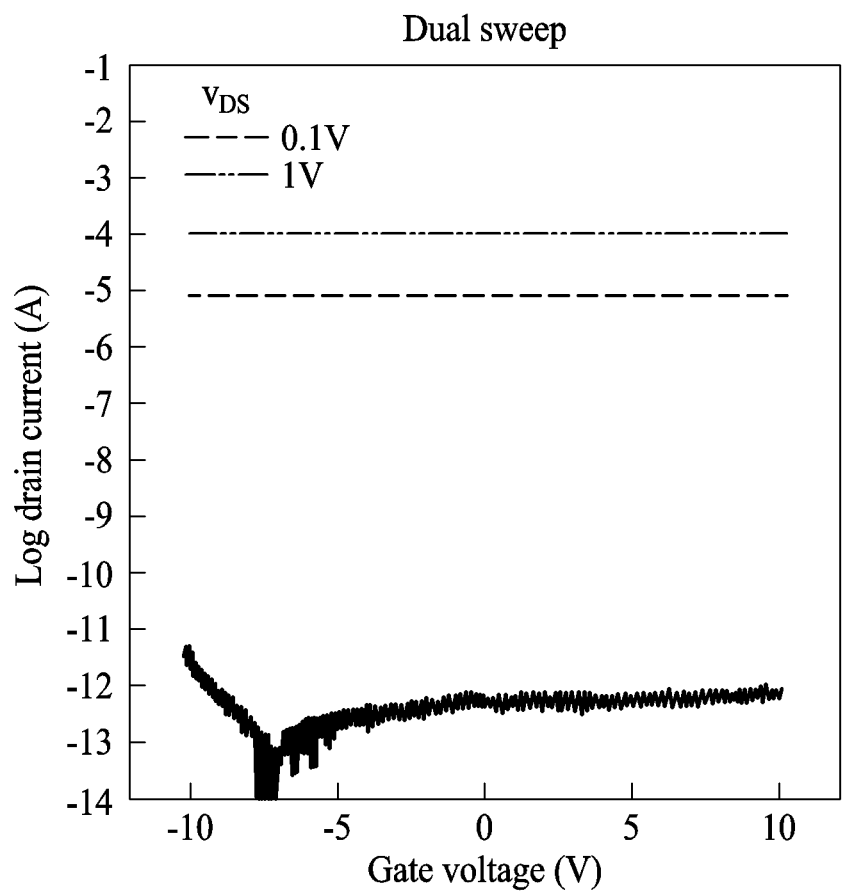

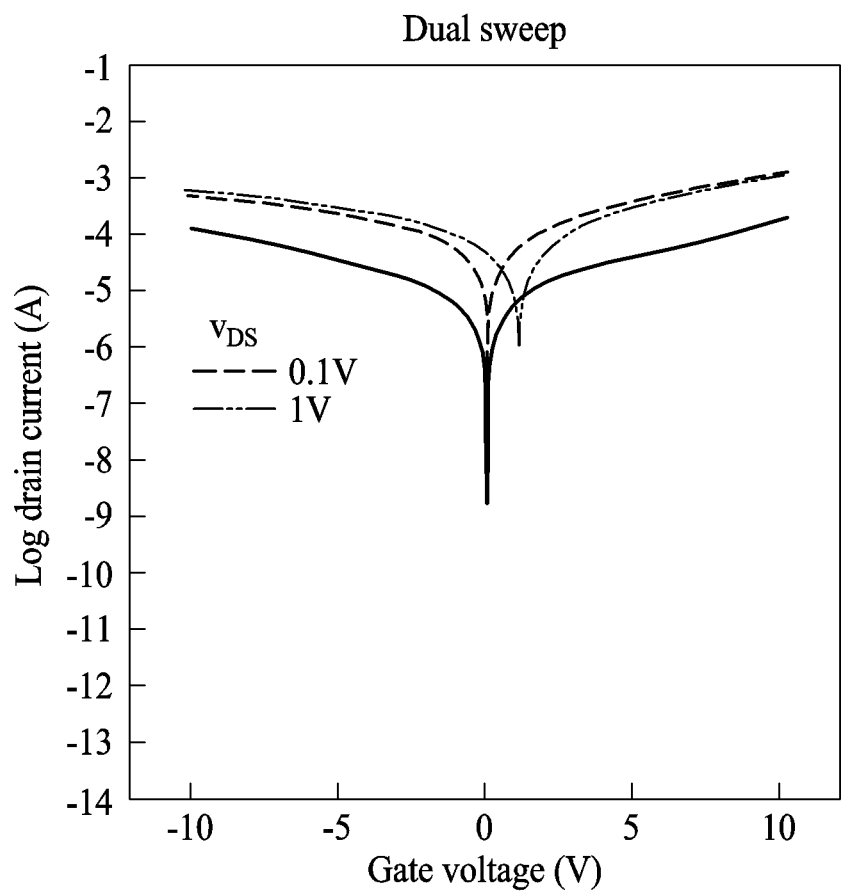
[FIG. 4B]

[FIG. 4C]
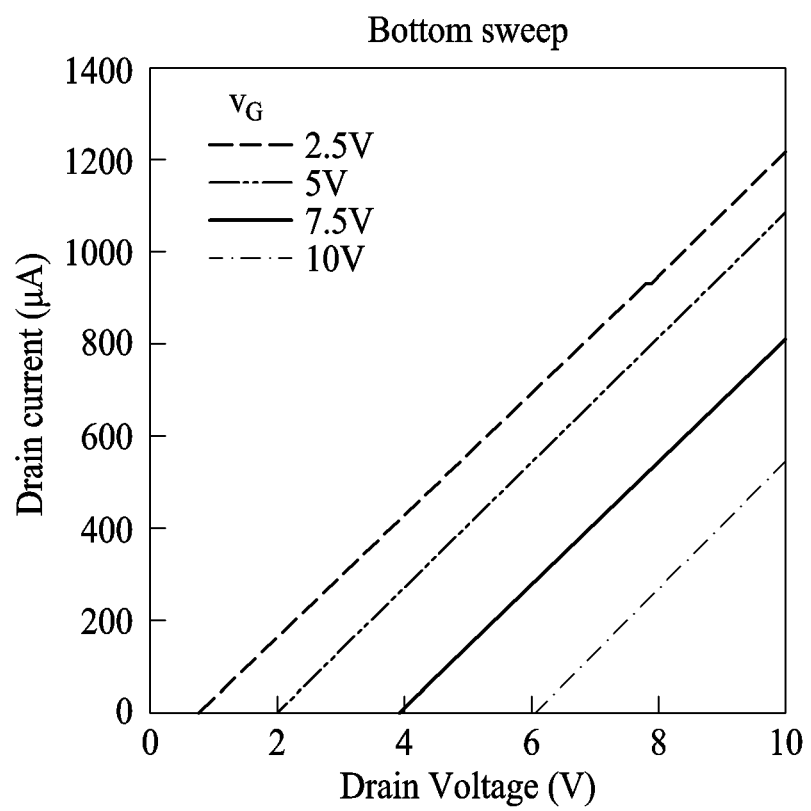

[FIG. 4D]
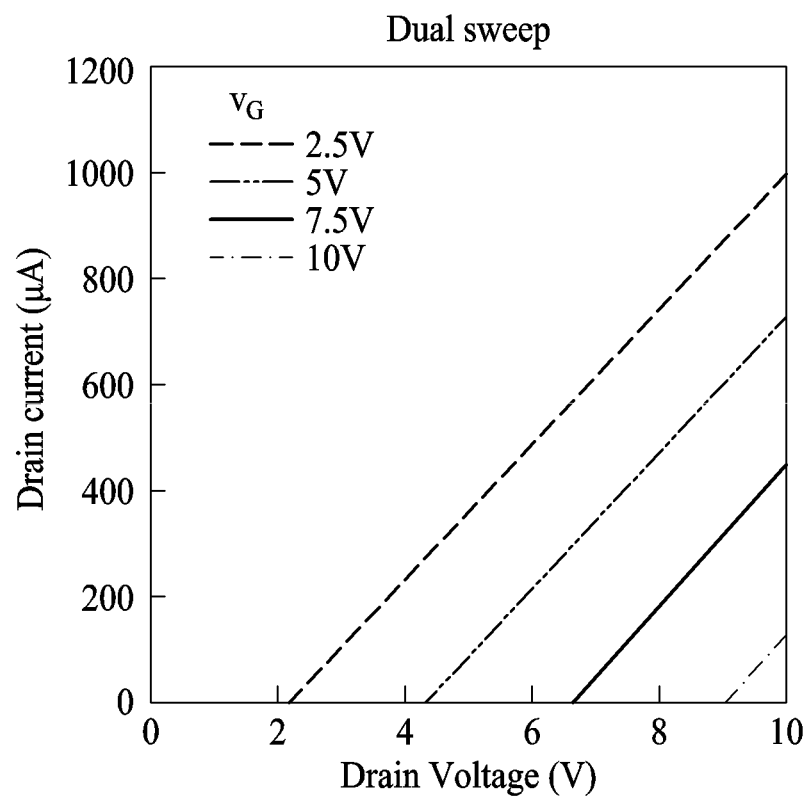

[FIG. 5A]
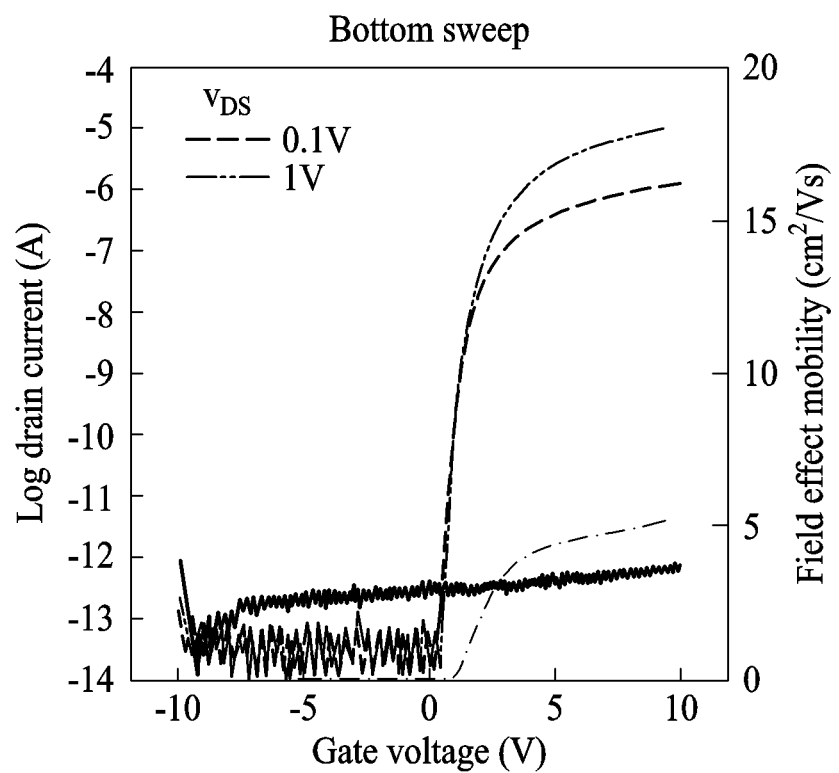

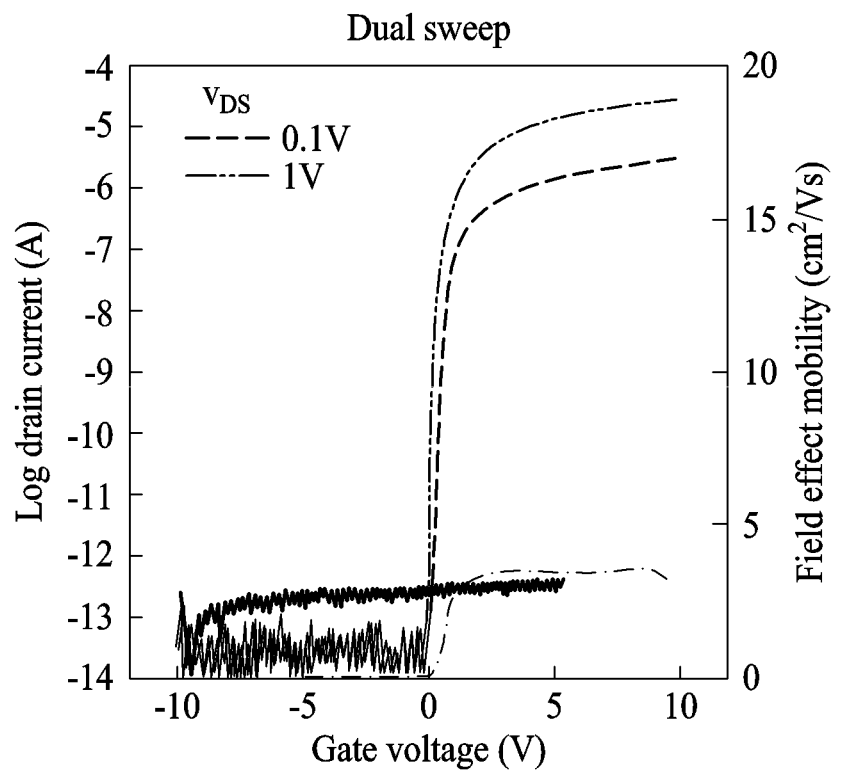
[FIG. 5B]

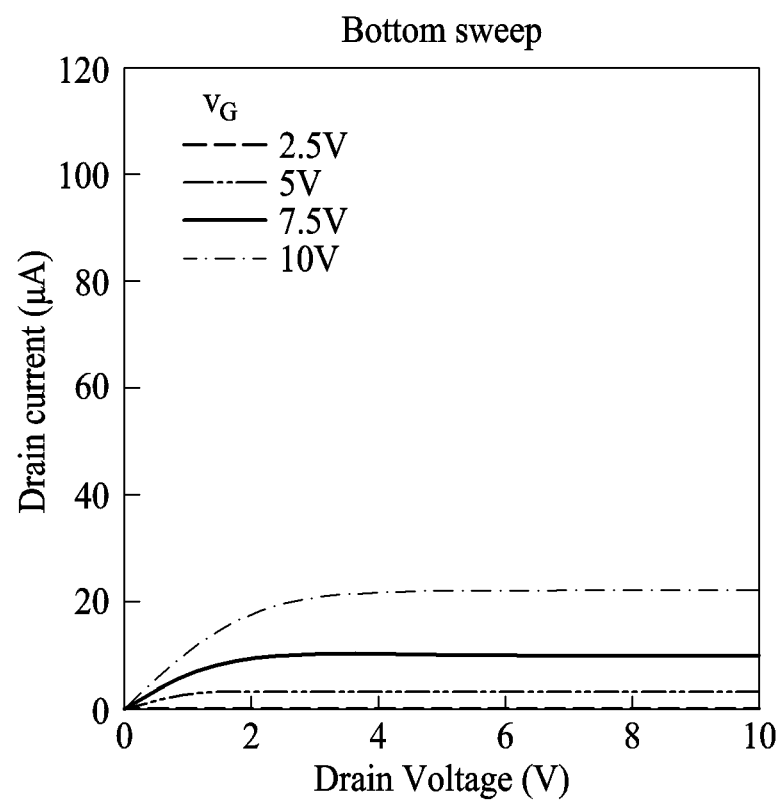
[FIG. 5C]

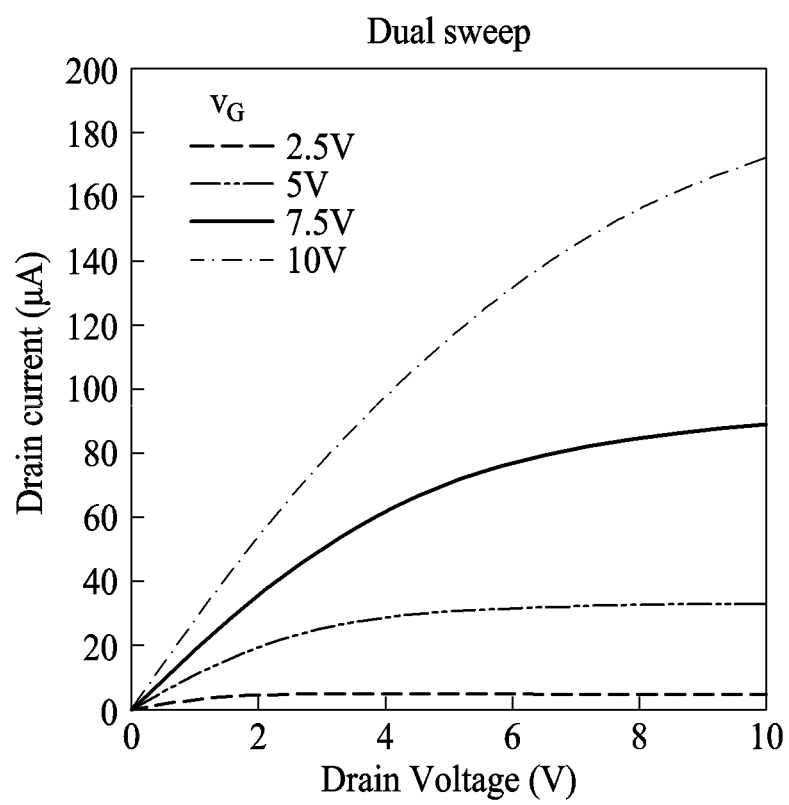
[FIG. 5D]

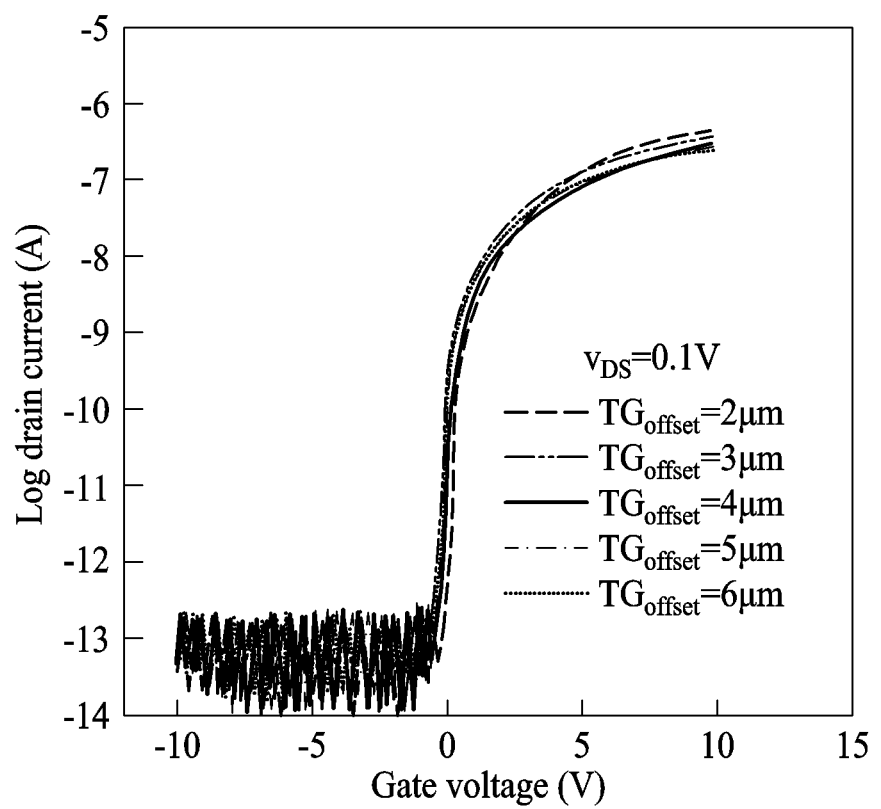
[FIG. 6A]

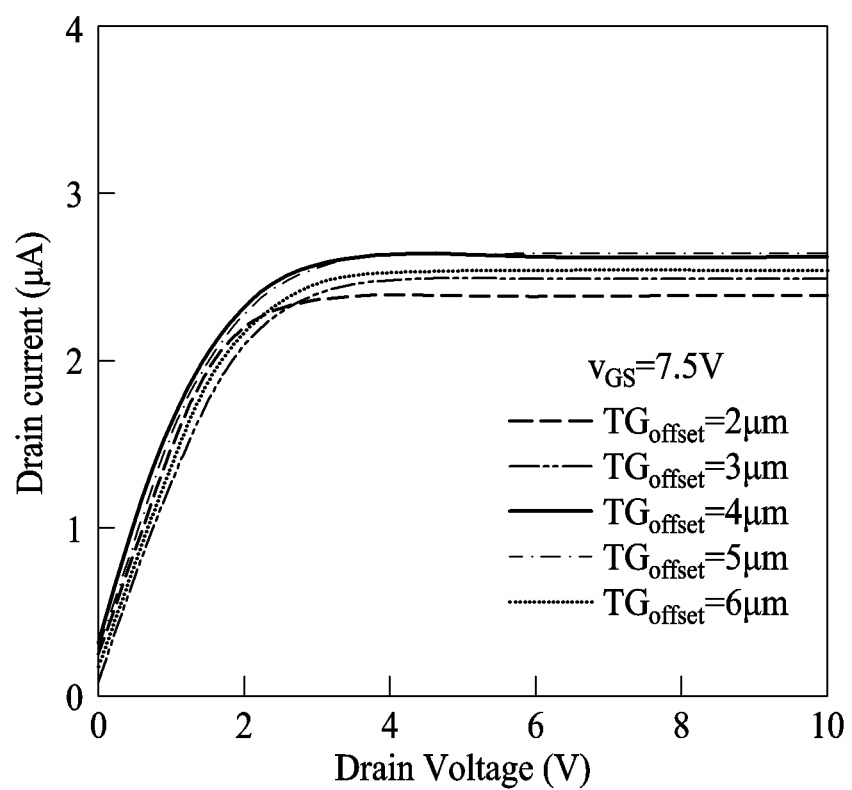
[FIG. 6B]

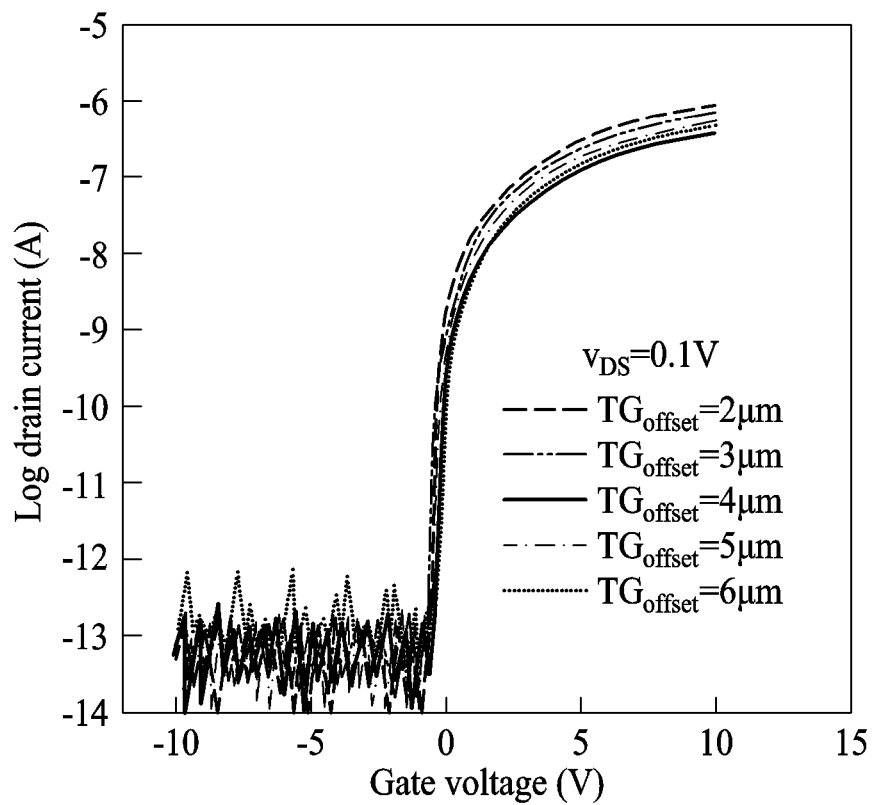
[FIG. 6C]

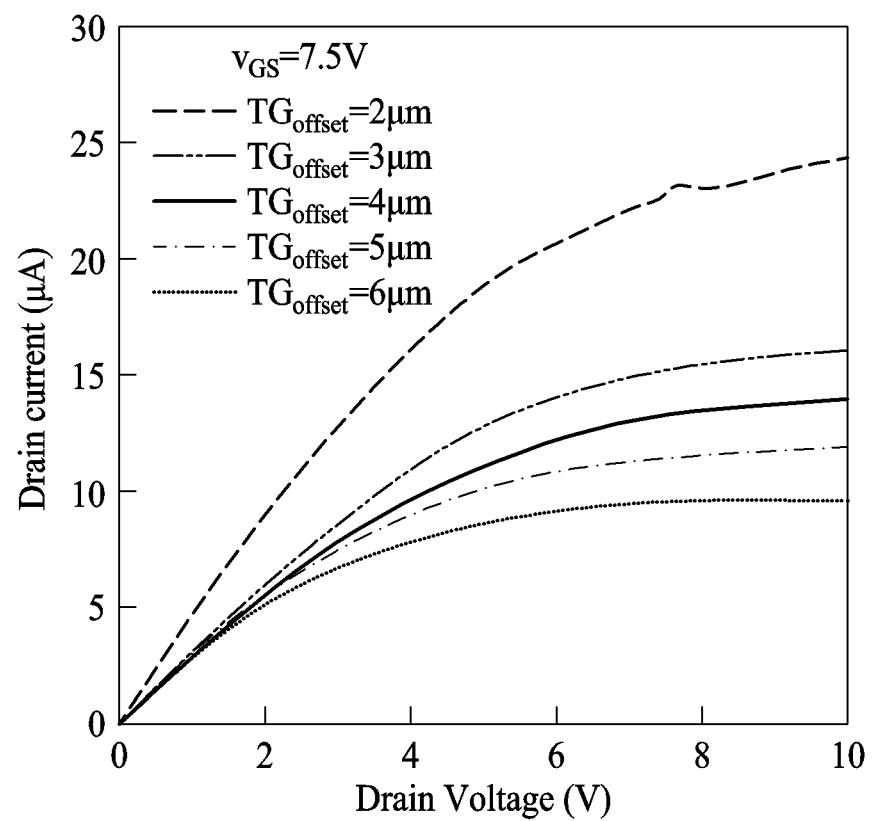
[FIG. 6D]

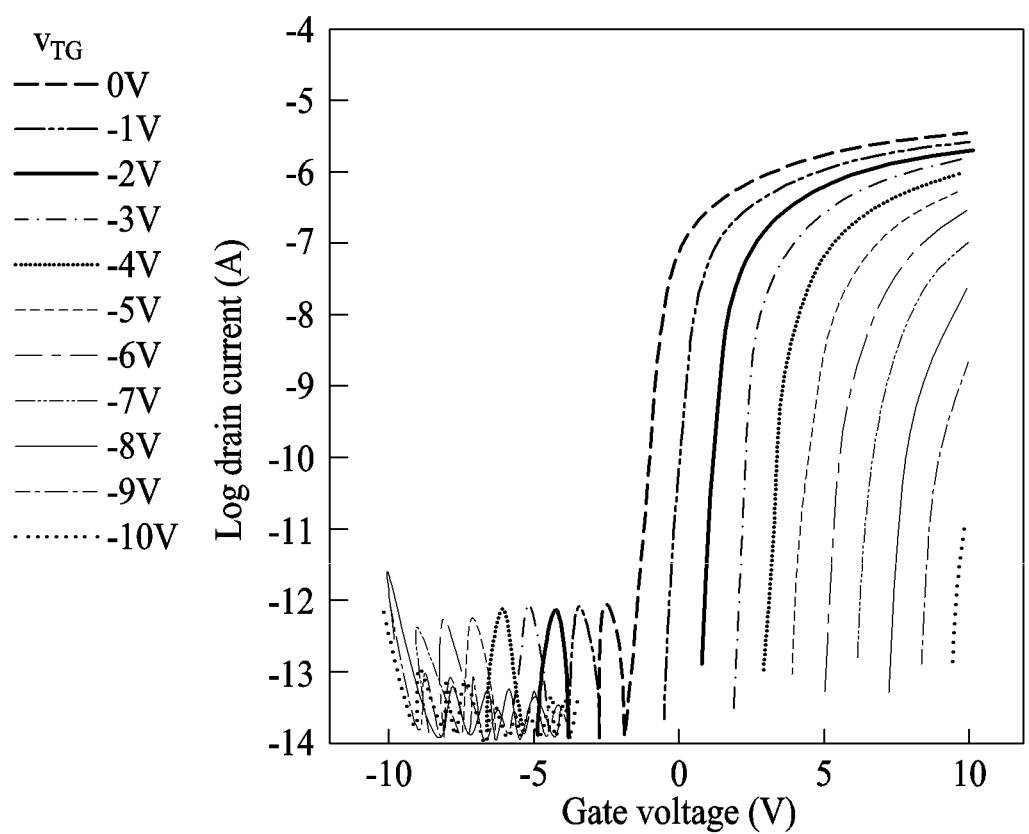
[FIG. 7A]

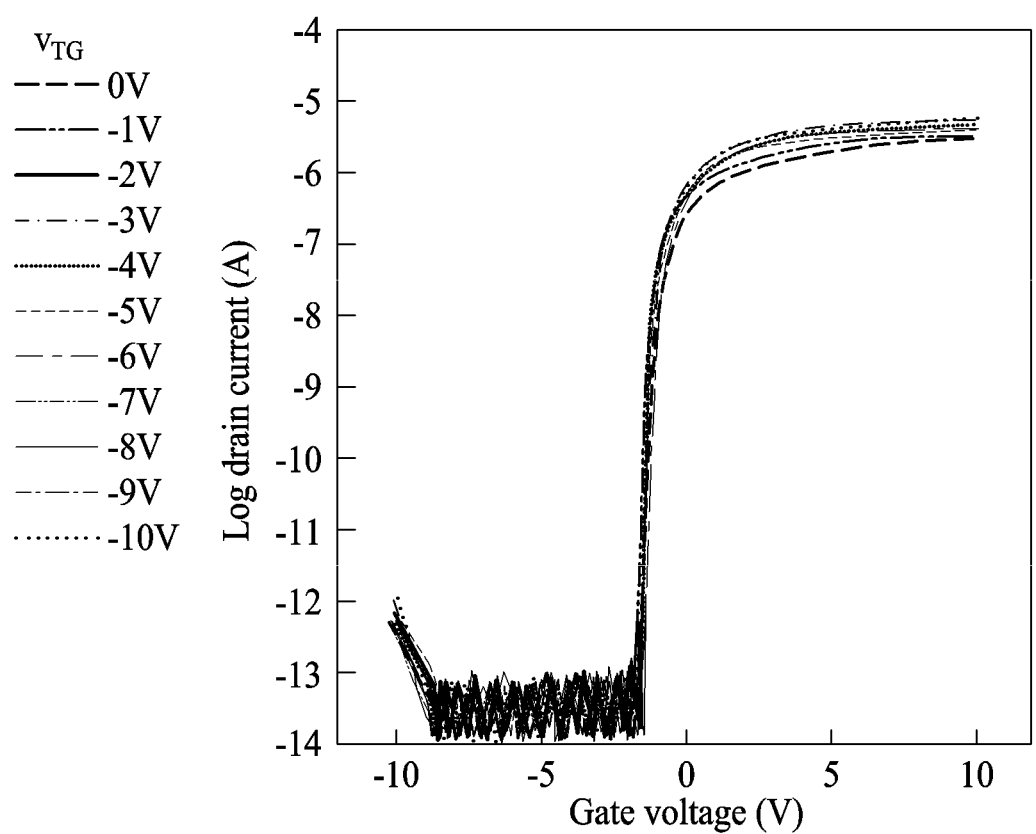
[FIG. 7B]

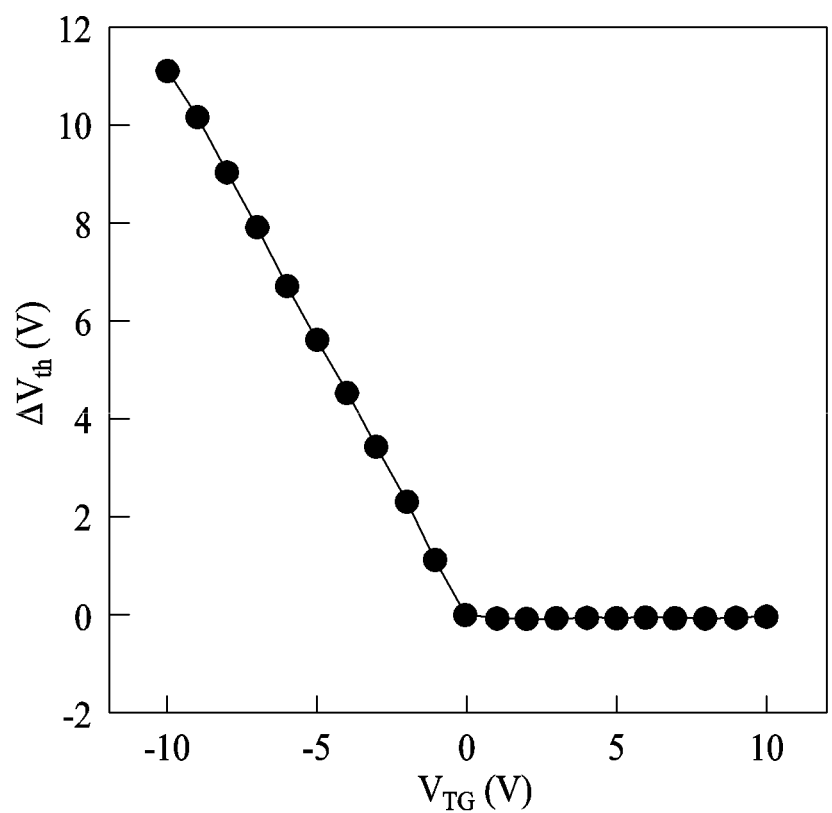

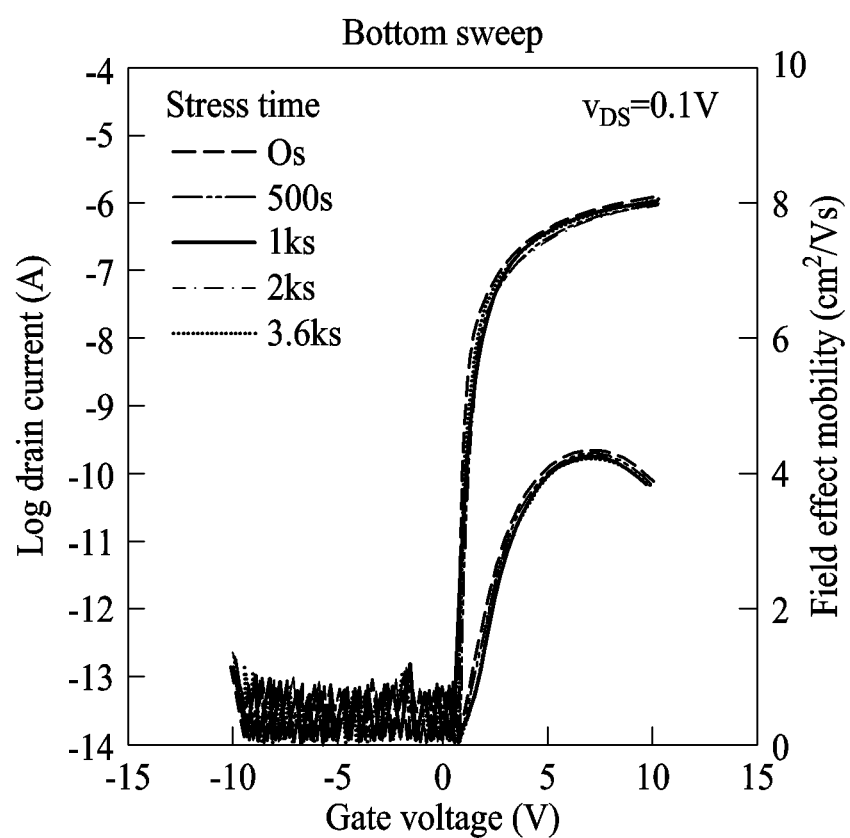
[FIG. 8A]

[FIG. 8B]
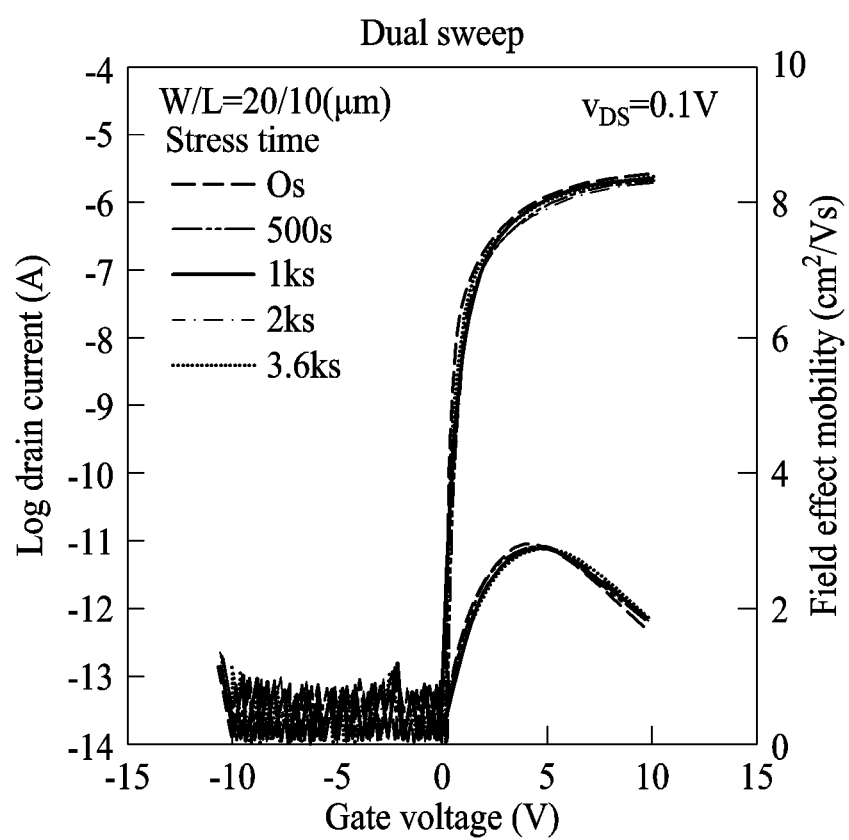

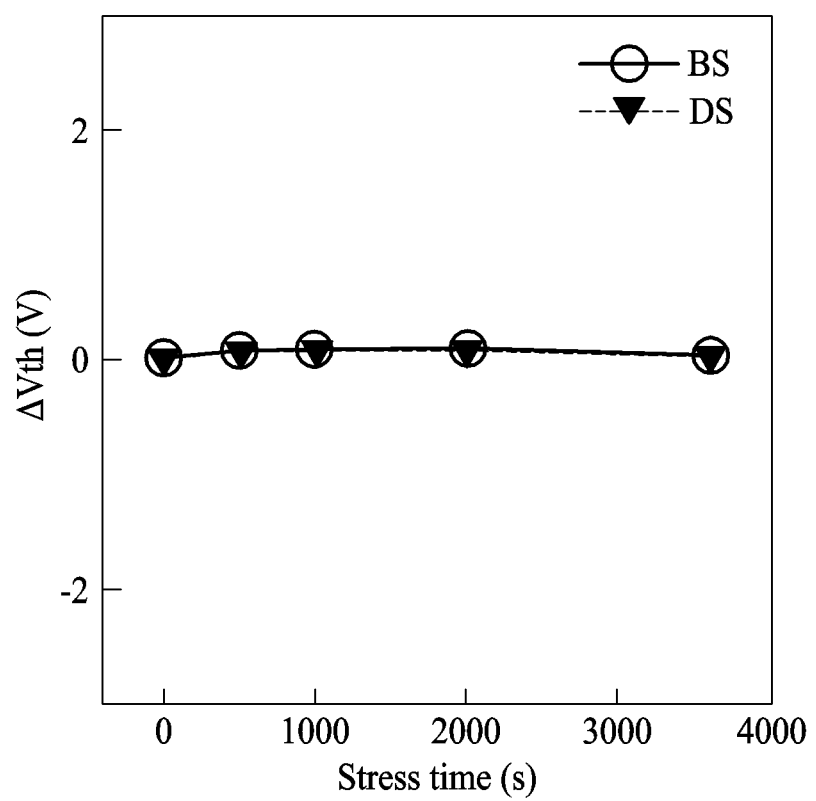
[FIG. 8C]

[FIG. 9A]
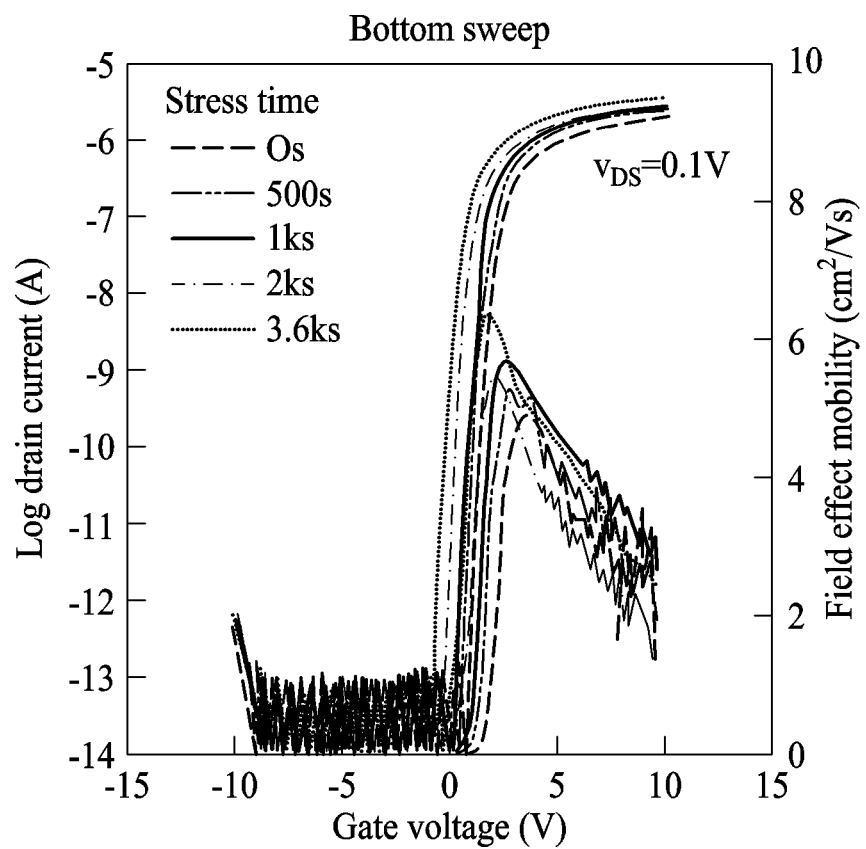

[FIG. 9B]
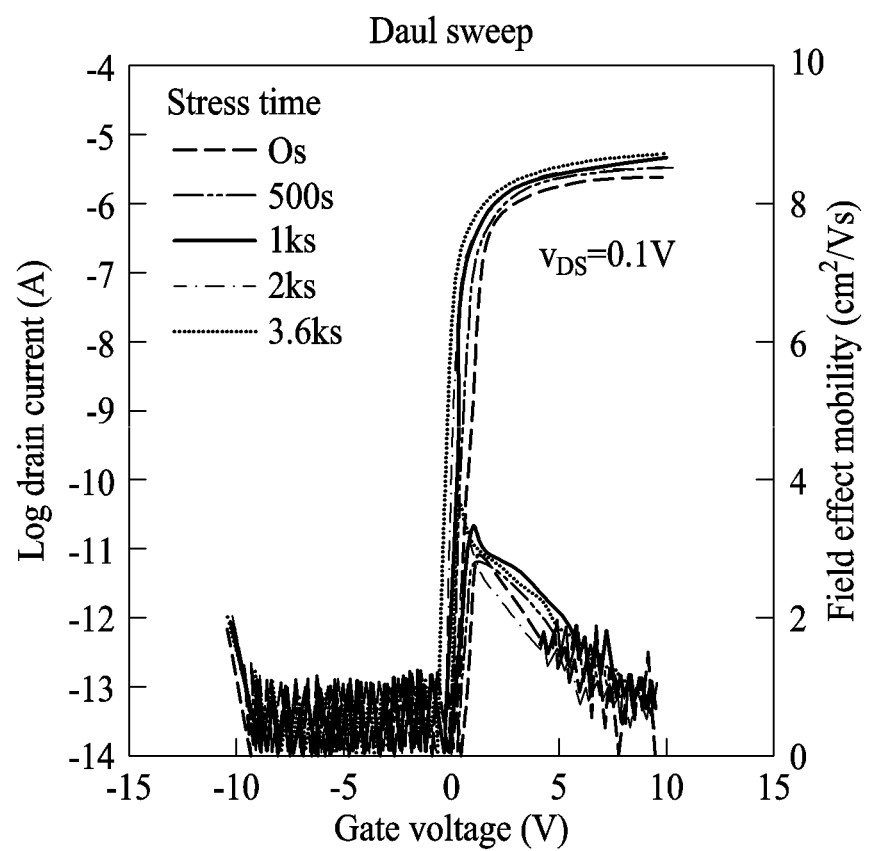

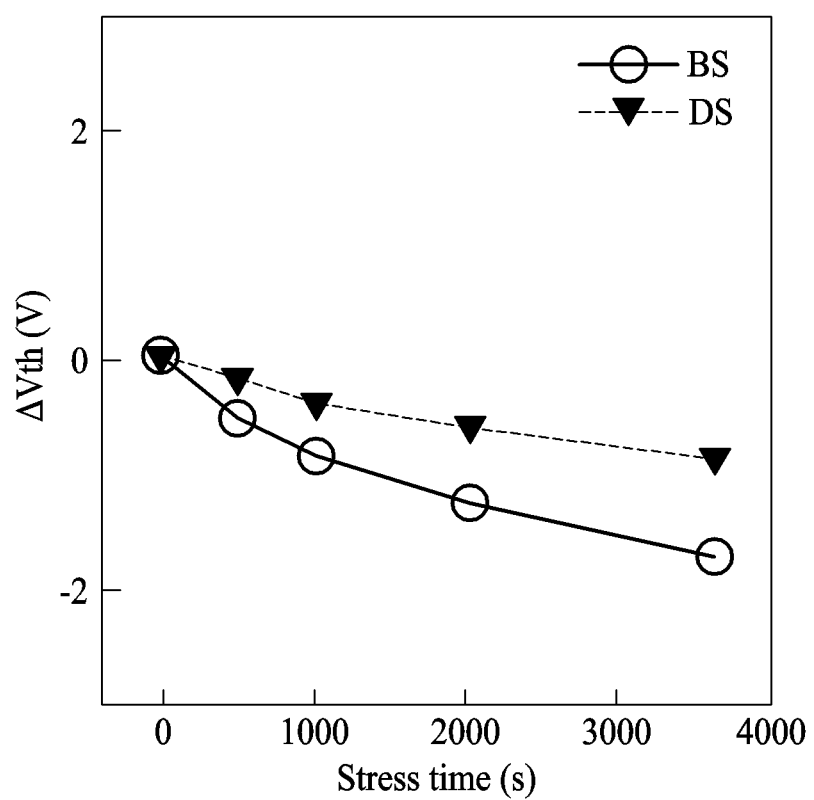
[FIG. 9C]

[FIG. 10A]
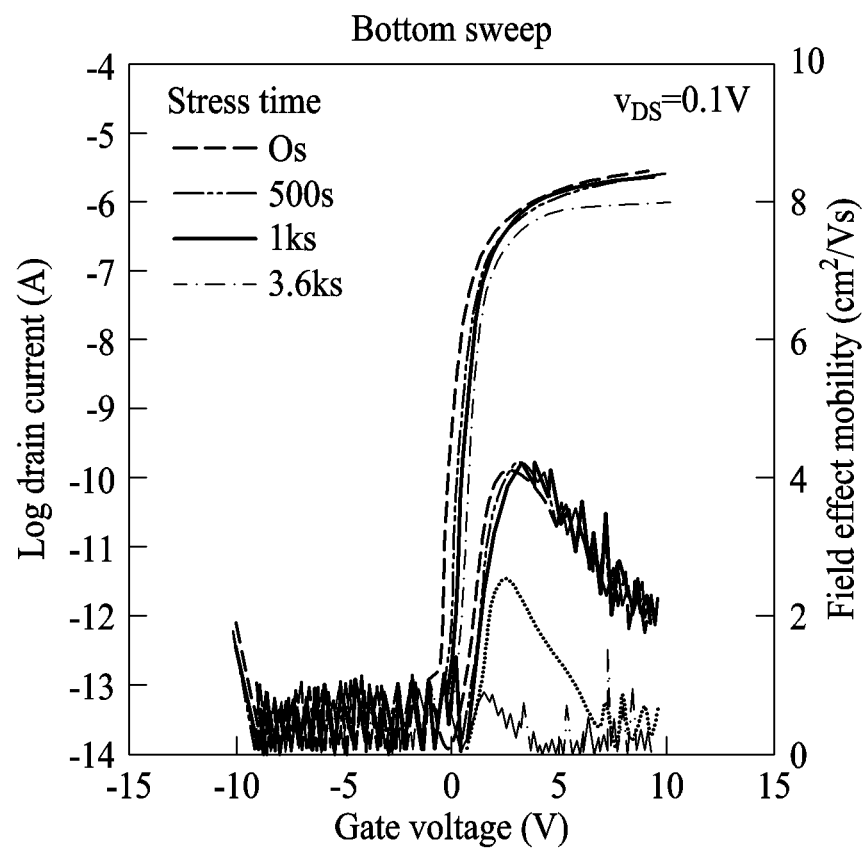

[FIG. 10B]
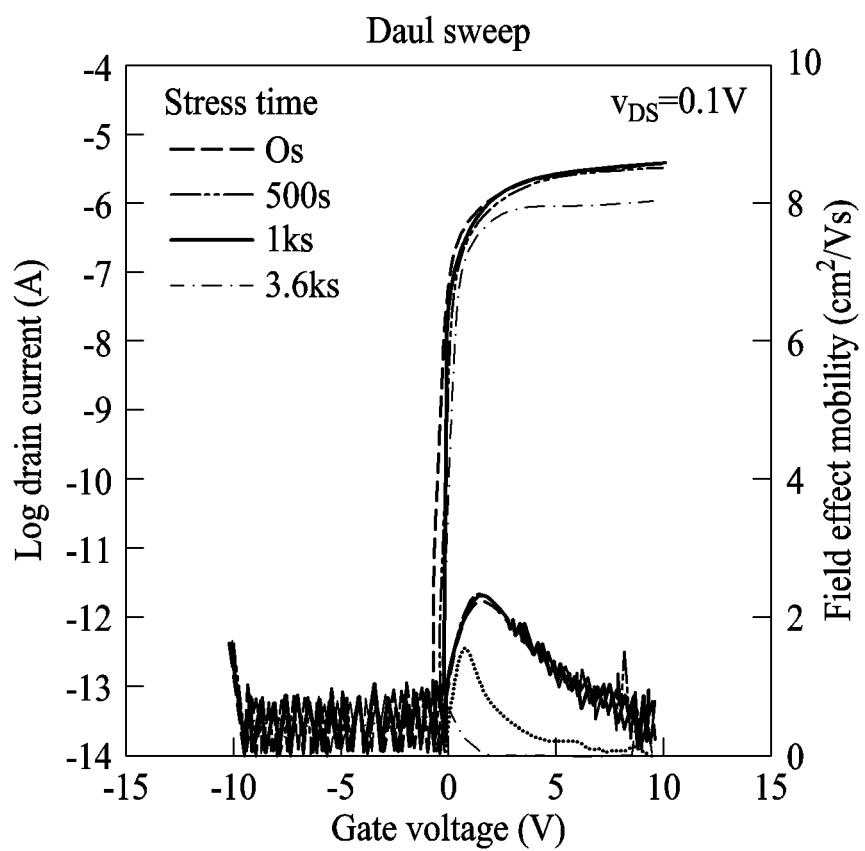

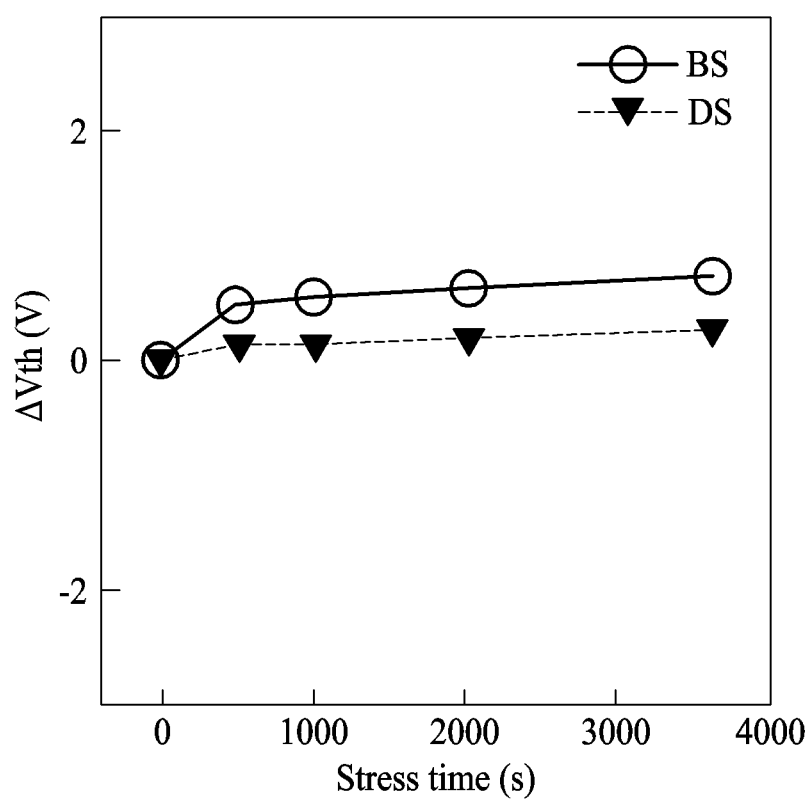
[FIG. 10C]

OXIDE SEMICONDUCTOR TRANSISTOR HAVING DUAL GATE STRUCTURE AND METHOD OF FABRICATING THE SAME

CROSS-REFERENCE TO RELATED APPLICATION

This application claims priority to Korean Patent Application No. 10-2016-0145338, filed on Nov. 2, 2016 in the Korean Intellectual Property Office, the disclosure of which is incorporated herein by reference.

This work was supported by the Technology Innovation Program (or Industrial Strategic Technology Development Program (10080454, Development of High-resolutions OLED Micro-Display and Controller SoC for AR/VR Device) funded By the Ministry of Trade, Industry & Energy (MOTIE, Korea).

TECHNICAL FIELD

The present invention relates to an oxide semiconductor transistor having a dual gate structure and a method of fabricating the same. More particularly, the present invention relates to an oxide semiconductor transistor having a dual gate structure and including a first gate insulating film, an oxide semiconductor film, and a second gate insulating film formed using a solution process and a method of fabricating the oxide semiconductor transistor.

BACKGROUND ART

Amorphous silicon (a-Si) thin film transistors, a type of silicon (Si)-based thin film transistors, are easy to fabricate but have low electron mobility. On the other hand, compared with the amorphous silicon (a-Si) thin film transistors, poly-silicon (poly-Si) thin film transistors have high electron mobility and high stability, and thus can be applied to a large-area high-definition display. However, in the case of the poly-silicon (poly-Si) thin film transistors, there are problems such as a complicated fabrication process, high fabrication costs, and requirement of a compensating circuit due to non-uniform device characteristics in a panel.

To solve the disadvantages of the silicon (Si)-based thin film transistors, oxide semiconductor thin film transistors are being developed. The oxide thin film transistors have higher mobility and lower leakage current than conventional amorphous silicon (a-Si) thin film transistors, and thus are attracting much attention as a next generation driving device for displays.

Methods of forming an oxide semiconductor used as the active layer region of an oxide thin film transistor can be roughly classified into two types. First, there is a method of physically or chemically depositing an oxide semiconductor on a substrate using vacuum equipment. Secondly, there is a method of forming an oxide semiconductor using a solution process.

However, the method of physically or chemically depositing an oxide semiconductor on a substrate using vacuum equipment has a disadvantage of high fabrication costs.

To overcome this advantage, a solution process is used to form an oxide semiconductor. However, the solution process is only used for a single gate structure.

In addition, in recent years, technology for applying a dual gate structure having improved electrical properties over a single gate structure to an oxide semiconductor thin film transistor has been required.

In addition, compared with an oxide semiconductor transistor using a deposition process, a conventional oxide semiconductor transistor having a single gate structure fabricated using a solution process has low mobility and problems in current and reliability, and thus commercialization thereof is difficult.

In addition, when a thin film transistor is fabricated using a solution process, pH characteristics are changed depending on the type of solvents, which causes the oxide semiconductor transistor to have non-uniform electrical properties.

RELATED ART DOCUMENTS

Patent Documents

Korean Patent No. 1108176, "DOUBLE GATE THIN FILM TRANSISTOR AND ORGANIC LIGHT EMITTING DISPLAY HAVING THE SAME"

Korean Patent No. 0205868, "DOUBLE GATE THIN FILM TRANSISTOR AND METHOD OF FABRICATING THE SAME"

Korean Patent No. 0931587, "LIQUID CRYSTAL DISPLAY AND METHOD OF FABRICATING THE SAME"

DISCLOSURE

Technical Problem

Therefore, the present invention has been made in view of the above problems, and it is one object of the present invention to provide an oxide semiconductor transistor having a dual gate structure with improved electrical properties including a first gate insulating film, an oxide semiconductor film, and a second gate insulating film formed using a solution process.

It is another object of the present invention to provide an oxide semiconductor transistor, the electrical properties of which are controlled by reducing the amount of drain leakage current by adjusting an offset indicating at least one of width between one end of a second gate electrode and a source electrode and width between the other end of the second gate electrode and a drain electrode to be 1 μm or more.

It is yet another object of the present invention to provide an oxide semiconductor transistor having a dual gate structure, in which the amount of current passing through a source electrode and a drain electrode is increased by increasing the concentration of electrons accumulated in an oxide semiconductor film. According to the present invention, the oxide semiconductor transistor has stabilizing characteristics, which are verified by a reliability test on positive voltages, negative voltages, and temperatures.

It is yet another object of the present invention to provide an oxide semiconductor transistor with a dual gate structure formed using a solution process. According to the present invention, compared with an oxide semiconductor transistor having a single gate structure, the oxide semiconductor transistor of the present invention has improved electrical properties, current properties, and stability.

It is yet another object of the present invention to provide an oxide semiconductor transistor with a dual gate structure, the electrical properties of which are improved by controlling pH characteristics depending on the type of solvents during a solution process. According to the present invention, the process time and process costs may be reduced through process simplification.

Technical Solution

In accordance with one aspect of the present invention, provided is an oxide semiconductor transistor including a substrate; a first gate electrode formed on the substrate; a first gate insulating film formed on the first gate electrode; a source electrode and a drain electrode separately formed on one surface of the first gate insulating film; an oxide semiconductor film formed on the first gate insulating film and the source and drain electrodes; a second gate insulating film formed on the oxide semiconductor film; pixel electrodes separately formed on one surface of the second gate insulating film and electrically connected to the source and drain electrodes, respectively; and a second gate electrode formed on the second gate insulating film, wherein an offset, which is a non-overlap region, present between the source electrode and the second gate electrode and an offset, which is a non-overlap region, present between the drain electrode and the second gate electrode are each adjusted to be 1 μm or more to increase the channel width of the oxide semiconductor film to control the electrical properties of the oxide semiconductor transistor.

The offset may be at least one of width between one end of the second gate electrode and the source electrode and width between the other end of the second gate electrode and the drain electrode.

At least one of the first and second gate insulating films and the oxide semiconductor film may be formed using a solution process.

The first and second gate electrodes may be electrically connected to each other to receive identical voltages.

The second gate electrode may be formed to have a length of 2 μm or more.

The first gate insulating film may include at least one of aluminum oxide ($Al_2O_3$), zirconium oxide ($ZrO_x$), zirconium aluminum oxide ($ZrAlO_x$), and hafnium oxide ($HfO_x$).

The oxide semiconductor film may include at least one of indium gallium zinc oxide (IGZO), indium oxide (InO), zinc oxide (ZnO), indium gallium oxide (IGO), indium aluminum oxide (IAO), indium zinc oxide (IZO), indium tin oxide (ITO), zinc tin oxide (ZTO), gallium zinc oxide (GZO), hafnium indium zinc oxide (HIZO), indium zinc tin oxide (IZTO), and aluminum zinc tin oxide (AZTO).

The second gate insulating film may include at least one of yttrium oxide ($Y_2O_3$), zirconium oxide ($ZrO_x$), and zirconium aluminum oxide ($ZrAlO_x$).

The second gate insulating film may be formed using a water ($H_2O$)-based solvent.

In addition, a configuration of the first and second gate insulating films may include at least one of substances suggested as the first and second gate insulating films.

The oxide semiconductor film may be formed to have a channel length of 4 μm or more.

The oxide semiconductor transistor according to an embodiment of the present invention may include a passivation layer formed on the second gate electrode.

In accordance with another aspect of the present invention, provided is a method of fabricating an oxide semiconductor transistor including a step of forming a first gate electrode on a substrate; a step of forming a first gate insulating film using a solution process on the first gate electrode; a step of separately forming a source electrode and a drain electrode on one surface of the first gate insulating film; a step of forming an oxide semiconductor film on the first gate insulating film and the source and drain electrodes; a step of forming a second gate insulating film using a solution process on the oxide semiconductor film; a step of separately forming pixel electrodes, which are electrically connected to the source and drain electrodes, respectively, on one surface of the second gate insulating film; and a step of forming a second gate electrode on the second gate insulating film, wherein an offset, which is a non-overlap region, present between the source electrode and the second gate electrode and an offset, which is a non-overlap region, present between the drain electrode and the second gate electrode are each adjusted to be 1 μm or more to increase the channel width of the oxide semiconductor film to control the electrical properties of the oxide semiconductor transistor.

The offset may be at least one of width between one end of the second gate electrode and the source electrode and width between the other end of the second gate electrode and the drain electrode.

At least one of the first and second gate insulating films and the oxide semiconductor film may be formed using a solution process.

Advantageous Effects

According to an embodiment of the present invention, the electrical properties of an oxide semiconductor transistor can be improved by forming the oxide semiconductor transistor to have a dual gate structure including an oxide thin film formed using a solution process.

In addition, according to an embodiment of the present invention, the electrical properties of an oxide semiconductor transistor can be controlled by reducing the amount of drain current by adjusting an offset, which is a non-overlap region, present between a source electrode and a second gate electrode and an offset, which is a non-overlap region, present between a drain electrode and the second gate electrode to be 1 μm or more.

In addition, according to an embodiment of the present invention, by forming an oxide semiconductor transistor having a dual gate structure, the amount of current passing through a source electrode and a drain electrode can be increased by increasing the width of a channel formed on an oxide semiconductor film. In addition, stabilizing characteristics which are verified by a reliability test on positive voltages, negative voltages, and temperatures can be provided.

According to an embodiment of the present invention, by forming an oxide semiconductor transistor with a dual gate structure using a solution process, compared with an oxide semiconductor transistor with a single gate structure, current properties and stability can be improved, thereby improving electrical properties.

In addition, according to an embodiment of the present invention, by forming a gate insulating film or an oxide semiconductor film using a solution process, the electrical properties of an oxide semiconductor transistor with a dual gate structure can be improved by adjusting pH characteristics depending on the type of solvents, and process time and process costs can be reduced through process simplification.

DESCRIPTION OF DRAWINGS

FIG. 1 is a cross-sectional view of an oxide semiconductor transistor according to an embodiment of the present invention.

FIG. 2 is a flowchart showing a method of fabricating an oxide semiconductor transistor according to an embodiment of the present invention.

FIGS. 3A and 3B are graphs showing the electrical properties of an oxide semiconductor transistor according to a comparative example.

FIGS. 4A to 4D are graphs showing the electrical properties of the dual gate overlap structure of an oxide semiconductor transistor according to a comparative example.

FIGS. 5A to 5D are graphs showing the electrical properties using a bottom sweep of an oxide semiconductor transistor according to an embodiment of the present invention and the electrical properties using a dual sweep of the oxide semiconductor transistor.

FIGS. 6A to 6D are graphs showing the electrical properties depending on the offset length of the upper gate of an oxide semiconductor transistor according to an embodiment of the present invention.

FIGS. 7A to 7C are graphs showing the electrical properties of an oxide semiconductor transistor according to an embodiment of the present invention when a threshold voltage is controlled using an applied gate-source voltage (VGS).

FIGS. 8A to 8C are graphs showing the electrical properties using a bottom sweep or a dual sweep after performing a reliability test on an oxide semiconductor transistor according to an embodiment of the present invention at a positive voltage of +5 V.

FIGS. 9A to 9C are graphs showing the electrical properties using a bottom sweep or a dual sweep after performing a reliability test on an oxide semiconductor transistor according to an embodiment of the present invention at a positive voltage of +5 V and a temperature of 60° C.

FIGS. 10A to 10C are graphs showing the electrical properties using a bottom sweep or a dual sweep after performing a reliability test on an oxide semiconductor transistor fabricated using a solution process according to an embodiment of the present invention at a negative voltage of −5 V and a temperature of 60° C.

BEST MODE

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

In addition, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

FIG. 1 is a cross-sectional view of an oxide semiconductor transistor according to an embodiment of the present invention.

In the oxide semiconductor transistor according to an embodiment of the present invention, a first gate electrode 104 is formed on a substrate 102, a first gate insulating film 106 is formed on the first gate electrode 104, and a source electrode 108 and a drain electrode 112 are separately formed on one surface of the first gate insulating film 106.

An oxide semiconductor film 114 is formed on the first gate insulating film 106, the source electrode 108, and the drain electrode 112, a second gate insulating film 116 is formed on the oxide semiconductor film 114, pixel electrodes 118 and 119 electrically connected to the source electrode 108 and the drain electrode 112, respectively, are separately formed on one surface of the second gate insulating film 116, and a second gate electrode 120 is formed on the second gate insulating film 116.

In addition, at least one of the first gate insulating film 106, the oxide semiconductor film 114, and the second gate insulating film 116 may be formed using a solution process.

In addition, the oxide semiconductor transistor according to an embodiment of the present invention includes an offset 124, which is a non-overlap region, between the source electrode 108 and the second gate electrode 120 and an offset 124, which is a non-overlap region, between the drain electrode 112 and the second gate electrode 120.

The offset 124 indicates at least one of width between one end of the second gate electrode 120 and the source electrode 112 and width between the other end of the second gate electrode 120 and the drain electrode 114.

In addition, each of the offsets 124 is adjusted to be 1 µm or more, thereby reducing the amount of drain current so that the electrical properties of the oxide semiconductor transistor according to an embodiment of the present invention may be controlled.

In addition, when the offsets are 1 µm or less, leakage current or a parasitic voltage may be generated between the second gate electrode 120 and the source electrode 112 and between the second gate electrode 120 and the drain electrode 114.

In the case of a structure not including offsets between the first or second gate electrode 104 or 120 and the source electrode 112 and between the first or second gate electrode 104 or 120 and the drain electrode 114, leakage current or a parasitic voltage may be generated between the electrodes, thereby deteriorating the electrical properties of an oxide semiconductor transistor.

However, since the oxide semiconductor transistor according to an embodiment of the present invention has a dual gate structure including offsets, the electrical properties of the oxide semiconductor transistor may be effectively complemented.

Hereinafter, a method of fabricating an oxide semiconductor transistor will be described in detail with reference to FIG. 2.

FIG. 2 is a flowchart showing a method of fabricating an oxide semiconductor transistor according to an embodiment of the present invention.

In the method of fabricating an oxide semiconductor transistor according to an embodiment of the present invention, in Step S210, a first gate electrode is formed on a substrate.

The substrate is a base substrate used in the art to form an oxide semiconductor transistor, and the type of materials used to form the substrate is not particularly limited. For example, various materials such as silicon, glass, plastic, quartz, and metal foil may be used.

The first gate electrode may be formed by depositing a gate conductive film on the substrate, forming a photoresist pattern on the gate conductive film, and then selectively etching, i.e., patterning, the gate conductive film using the photoresist pattern as a mask.

The first gate electrode may be formed to have a thickness of 10 nm or more. When the thickness of the first gate electrode is less than 10 nm, a problem of resistance increase in the first gate electrode may occur.

The first gate electrode may include a metal or a metal oxide, which is a conductive material. As a specific example, at least one of a metal such as molybdenum (Mo), aluminum (Al), chromium (Cr), gold (Au), titanium (Ti), or silver (Ag) and a metal oxide such as indium tin oxide (ITO), indium zinc oxide (IZO), or indium tin zinc oxide (ITZO) may be included.

The first gate electrode may be formed using a deposition process such as chemical vapor deposition, physical vapor deposition, and atomic layer deposition.

In Step S220, a first gate insulating film is formed using a solution process on the first gate electrode.

The first gate insulating film may be formed using a solution process. Specifically, the first gate insulating film may be formed using any one of solution processes including spin coating, slit dye coating, inkjet printing, spray coating, and dip coating.

The first gate insulating film is preferably formed using spin coating. Here, in the spin coating method, a predetermined amount of a solution is dropped on a substrate, and the substrate is rotated at a high speed so that the substrate is coated with the solution by centrifugal force applied to the solution.

According to an embodiment of the present invention, since the first gate insulating film is formed using a solution process, fabrication costs may be reduced compared with a deposition process.

In addition, when the first gate insulating film is formed using a solution process according to an embodiment of the present invention, the process cost and process time may be reduced through simplification of the process.

That is, compared with conventional solution process-based thin film transistors, the solution process-based dual gate structure according to an embodiment of the present invention may exhibit improved current properties and stability, thereby improving the electrical properties thereof.

The first gate insulating film may include at least one of aluminum oxide ($Al_2O_3$), zirconium oxide ($ZrO_X$), zirconium aluminum oxide ($ZrAlO_X$), and hafnium oxide ($HfO_X$).

In Step S230, a source electrode and a drain electrode are separately formed on one surface of the first gate insulating film.

The source and drain electrodes are formed on the substrate on which the first gate insulating film has been formed. Specifically, the source and drain electrodes are formed to be spaced apart from each other on the substrate on which the first gate insulating film has been formed.

Each of the source and drain electrodes may include a metal or a metal oxide. Specifically, at least one of a metal such as molybdenum (Mo), aluminum (Al), chromium (Cr), gold (Au), titanium (Ti), or silver (Ag) and a metal oxide such as indium tin oxide (ITO), indium zinc oxide (IZO), or indium tin zinc oxide (ITZO) may be included.

In Step S240, an oxide semiconductor film is formed using a solution process on the first gate insulating film and the source and drain electrodes.

The oxide semiconductor film is formed using a solution process on the substrate on which the first gate electrode, the source electrode, and the drain electrode have been formed. Specifically, the oxide semiconductor film is formed using any one of solution processes including spin coating, slit dye coating, inkjet printing, spray coating, and dip coating.

The oxide semiconductor film is preferably formed using spin coating. Here, in the spin coating method, a predetermined amount of a solution is dropped on a substrate, and the substrate is rotated at a high speed so that the substrate is coated with the solution by centrifugal force applied to the solution.

The oxide semiconductor film may include any one of indium gallium zinc oxide (IGZO), indium oxide (InO), zinc oxide (ZnO), indium gallium oxide (IGO), indium aluminum oxide (IAO), indium zinc oxide (IZO), indium tin oxide (ITO), zinc tin oxide (ZTO), gallium zinc oxide (GZO), hafnium indium zinc oxide (HIZO), indium zinc oxide (IZTO), and aluminum zinc tin oxide (AZTO), and may have an amorphous or polycrystalline structure.

The oxide semiconductor film may be formed to have a thickness of 5 nm to 50 nm, and is preferably formed to have a thickness of 40 nm.

When the thickness of the oxide semiconductor film is less than 5 nm, since the thickness is very thin, thickness irregularity may occur, and as a result, current may be reduced.

In addition, the oxide semiconductor film may be formed to have a channel length of 4 µm or more.

In addition, the oxide semiconductor film may be formed using a solution containing an oxide precursor. For example, the oxide precursor may include $In(NO_3)_3H_2O$, $Ga(NO_3)_3H_2O$, or $Zn(CH_3COO)_2H_2O$, without being limited thereto.

According to an embodiment of the present invention, one or more oxide semiconductor films may be formed. Specifically, the oxide semiconductor film may be formed in a multilayer form by repeating a process of forming an oxide semiconductor thin film. When the oxide semiconductor film is formed in a multilayer form, the oxide semiconductor film may exhibit sufficient conductivity.

In addition, the oxide semiconductor film may be formed in a multilayer form. In this case, the thicknesses of each layer may be different.

According to an embodiment of the present invention, since the oxide semiconductor film is formed using a solution process, fabrication costs may be reduced compared with a deposition process.

When the oxide semiconductor film is formed, the substrate on which the first gate insulating film and the source and drain electrodes have been formed may be coated with a solution containing an oxide, and then annealing treatment may be performed, for example, at a temperature of 100° C. or more for 30 minutes.

In the annealing treatment performed after coating with the oxide semiconductor film, solvents and foreign substances contained in a solution for forming the oxide semiconductor film may be removed, thereby improving the electrical properties of the oxide semiconductor film.

Specifically, when the oxide semiconductor film is subjected to annealing treatment, the conductivity of the oxide semiconductor film may be improved.

The oxide semiconductor film formed according to an embodiment of the present invention may be subjected to selective etching to act as an active layer.

In Step S250, a second gate insulating film is formed using a solution process on the oxide semiconductor film.

The second gate insulating film is formed using a solution process on the substrate on which the oxide semiconductor film has been formed. Specifically, the second gate insulating film is formed using any one of solution processes including spin coating, slit dye coating, inkjet printing, spray coating, and dip coating.

According to an embodiment of the present invention, since the second gate insulating film is formed using a solution process, fabrication costs may be reduced compared with a deposition process.

The second gate insulating film may include at least one of yttrium oxide ($Y_2O_3$), zirconium oxide ($ZrO_X$), and zirconium aluminum oxide ($ZrAlO_X$).

The pH of a solution for forming the second gate insulating film may be adjusted using a solvent. When the solution for forming the second gate insulating film is strongly acidic, the electrical properties of the layers (i.e., the oxide semiconductor film, the first gate, the source electrode, and the drain electrode) formed on the lower side of the second gate insulating film may be affected.

Preferably, a water ($H_2O$)-based solvent may be used as the solvent for forming the second gate insulating film. When the water ($H_2O$)-based solvent is used, damage to the layers (i.e., the oxide semiconductor film, the first gate, the source electrode, and the drain electrode) formed on the lower side of the second gate insulating film may be reduced, and as a result, deterioration of the electrical properties of the oxide semiconductor film, the first gate, the source electrode, or the drain electrode may be prevented.

More preferably, yttrium oxide ($Y_2O_3$) using a water ($H_2O$)-based solvent is used as the second gate insulating film. When yttrium oxide ($Y_2O_3$) is used as the second gate insulating film, the pH of the oxide is higher than other materials, damage to the layers (i.e., the oxide semiconductor film, the first gate, the source electrode, and the drain electrode) formed on the lower side of the second gate insulating film may further be reduced.

As described above, by adjusting pH characteristics depending on the type of solvents during the solution process according to an embodiment of the present invention, the electrical properties of the oxide semiconductor transistor having a dual gate structure may be improved.

In Step S260, pixel electrodes electrically connected to the source and drain electrodes, respectively, are separately formed on one surface of the second gate insulating film.

The pixel electrodes are electrically connected to the source and drain electrodes, respectively, so that the source and drain electrodes are electrically connected to other components of the oxide semiconductor transistor.

The pixel electrodes may include a metal or a metal oxide. For example, the pixel electrodes may include at least one of molybdenum (Mo), indium zinc oxide (IZO), and indium tin oxide (ITO).

The pixel electrodes may be formed on one surface of the second gate insulating film so as to be electrically connected to the source and drain electrodes.

In addition, the pixel electrodes may be formed to extend long from the source and drain electrodes. That is, the pixel electrodes may be formed of the same material as the source and drain electrodes, and may be integrally formed with the source and drain electrodes.

In Step S270, a second gate electrode is formed on the second gate insulating film.

The second gate electrode is formed between the source and drain electrodes and includes offsets.

The offset indicates at least one of width between one end of the second gate electrode and the source electrode and width between the other end of the second gate electrode and the drain electrode.

The offsets of the second gate electrode may be adjusted to be 1 µm or more.

In the oxide semiconductor transistor according to an embodiment of the present invention, since a number of additional processes are performed in the upper interface of the oxide semiconductor film after forming the oxide semiconductor film, the number of defects in the upper interface of the oxide semiconductor film is larger than the number of defects in the lower interface of the oxide semiconductor film.

However, the offsets of the second gate electrode according to an embodiment of the present invention may reduce a defective region formed in the upper interface of the oxide semiconductor film, and as a result, threshold voltage change in positive bias stress (PBS) may be reduced to improve the electrical properties of the oxide semiconductor transistor.

In addition, when the same voltage is applied to the first and second gate electrodes, the width of a channel formed in the oxide semiconductor film may be increased, so that the amount of current passing through the source and drain electrodes may be increased. In addition, stabilizing characteristics may be shown in a reliability test for a positive voltage, a negative voltage, and temperature.

Therefore, the electrical properties of the oxide semiconductor transistor according to an embodiment of the present invention may be improved.

The second gate electrode may include a metal or a metal oxide, which is a conductive material. Specifically, at least one of a metal such as molybdenum (Mo), aluminum (Al), chromium (Cr), gold (Au), titanium (Ti), or silver (Ag) and a metal oxide such as indium tin oxide (ITO), indium zinc oxide (IZO), or indium tin zinc oxide (ITZO) may be included.

In addition, in the oxide semiconductor transistor according to an embodiment of the present invention, a passivation layer may be additionally formed on the second gate electrode.

The passivation layer may include at least one of an inorganic insulator such as silicon nitride (SiNx) or silicon oxide (SiOx), an organic insulator, and a low dielectric constant insulator.

The passivation layer may protect the oxide semiconductor transistor according to an embodiment of the present invention from the outside.

FIGS. 3A to 10C are graphs showing the electrical properties of an oxide semiconductor transistor according to a comparative example and an oxide semiconductor transistor according to an embodiment of the present invention.

In FIGS. 3A to 10C, the electrical properties according to a gate-source voltage (VGS) applied to the first gate electrode are referred to as bottom sweep (BS), the electrical properties according to the same gate-source voltage (VGS) applied to the first and second gate electrodes are referred to as dual sweep (DS), and offsets between the second gate electrode and the source and drain electrodes are referred to as top gate offsets (TOFFs).

FIGS. 3A and 3B are graphs showing the electrical properties of an oxide semiconductor transistor according to a comparative example.

FIG. 3A shows log values of drain current depending on gate voltages and thin film transistor (TFT) mobility depending on gate voltages, and FIG. 3B shows drain current values depending on drain voltages.

Referring to FIG. 3A, it can be confirmed that a drain current value is increased in proportion to the magnitude of a gate voltage.

In addition, referring to FIG. 3B, it can be confirmed that, when an applied gate voltage is increased from 2.5 V to 10 V, a drain voltage is increased, and consequently, drain current is increased.

FIGS. 4A to 4D are graphs showing the electrical properties of the dual gate overlap structure of an oxide semiconductor transistor according to a comparative example.

FIG. 4A shows log values of drain current depending on gate voltages in the bottom sweep, FIG. 4B shows log values of drain current depending on gate voltages in the dual sweep, FIG. 4C shows drain current values depending on drain voltages in the bottom sweep, and FIG. 4D shows drain current values depending on drain voltages in the dual sweep.

Referring to FIGS. 4A to 4D, it can be confirmed that, in the case of the comparative example, the switching characteristics of the oxide semiconductor transistor are not secured due to leakage current generating between the gate electrode and the source electrode or the drain electrode.

FIGS. 5A to 5D are graphs showing the electrical properties using a bottom sweep of an oxide semiconductor transistor according to an embodiment of the present invention and the electrical properties using a dual sweep of the oxide semiconductor transistor.

FIG. 5A shows log values of drain current when the second gate electrode is set to 0 V and the voltage of the first gate electrode is swept, FIG. 5B shows log values of drain current depending on sweep voltages when the first gate electrode and the second gate electrode are electrically connected to each other, FIG. 5C shows drain current values depending on drain voltages when the second gate electrode is set to 0 V and a voltage applied to the first gate electrode is increased from 2.5 V to 10 V, and FIG. 5D shows drain current values depending on drain voltages in the sweep when the first gate electrode and the second gate electrode are electrically connected to each other.

Referring to FIGS. 5A to 5D, it can be seen that current flowing in the drain electrode when the first gate electrode and the second gate electrode are electrically connected to each other is greater than drain current when the second gate electrode is set to 0 V and the voltage of the first gate electrode is increased.

FIGS. 6A to 6D are graphs showing the electrical properties depending on the offset length of the upper gate of an oxide semiconductor transistor according to an embodiment of the present invention.

FIGS. 6A and 6B are graphs showing the electrical properties of the bottom sweep depending on the offset length of the upper gate, and FIGS. 6C and 6D are graphs showing the electrical properties of the dual sweep depending on the offset length of the upper gate.

Referring to FIGS. 6A to 6D, it can be confirmed that the bottom sweep is not affected by the offset length of the upper gate.

In addition, it can be seen that the maximum value of current flowing in the drain electrode for the dual sweep is larger than for the bottom sweep, and increase width of current decreases as the offset length of the upper gate increases.

FIGS. 7A to 7C are graphs showing the electrical properties of an oxide semiconductor transistor according to an embodiment of the present invention when a threshold voltage is controlled using an applied voltage (VGS).

As shown in FIG. 7A, it can be confirmed that, when an applied voltage is sequentially changed from 0 V to a negative voltage of −10V, a threshold voltage changes depending on a voltage applied to the second gate electrode.

As shown in FIG. 7B, even when a voltage applied to the second gate electrode is sequentially changed from 0 V to a positive voltage of +10V, a threshold voltage does not change. These results indicate that the second gate electrode has top gate offsets.

FIG. 7C shows threshold voltages depending on voltages applied to the second gate.

Referring to FIG. 7C, it can be confirmed that the threshold voltage of the oxide semiconductor transistor according to an embodiment of the present invention is lowered.

FIGS. 8A to 8C are graphs showing the electrical properties using the bottom sweep and the dual sweep after performing a reliability test for a positive voltage of +5 V in the oxide semiconductor transistor according to an embodiment of the present invention.

FIG. 8A shows the electrical properties of the bottom sweep over time when a positive voltage of +5 V is applied to the first and second gate electrodes, and FIG. 8B shows the electrical properties of the dual sweep over time when a positive voltage of +5 V is applied to the first and second gate electrodes.

FIG. 8C shows threshold voltages over time.

As shown in FIGS. 8A to 8C, it can be confirmed that the dual sweep and the bottom sweep have reliability for a positive voltage of +5 V.

FIGS. 9A to 9C are graphs showing the electrical properties using a bottom sweep or a dual sweep after performing a reliability test on an oxide semiconductor transistor according to an embodiment of the present invention at a positive voltage of +5 V and a temperature of 60° C.

FIG. 9A shows the electrical properties of the bottom sweep over time when a positive voltage of +5 V is applied to the first and second gate electrodes, and FIG. 9B shows the electrical properties of the dual sweep over time when a positive voltage of +5 V is applied to the first and second gate electrodes.

FIG. 9C shows threshold voltages over time.

In addition, in FIGS. 9A to 9C, positive gate bias temperature stress (PBTS) conditions in which heat (60° C.) and a voltage of +5 V are applied are used.

In addition, FIGS. 9A and 9B show the electrical properties for the dual sweep of an oxide semiconductor thin film transistor having a channel length of 10 μm.

Referring to FIGS. 9A to 9C, it can be confirmed that the dual sweep has better reliability for PBTS than the bottom sweep.

FIGS. 10A to 10C are graphs showing the electrical properties using a bottom sweep or a dual sweep after performing a reliability test on an oxide semiconductor transistor according to an embodiment of the present invention at a negative voltage of −5 V and a temperature of 60° C.

FIG. 10A shows the electrical properties of the bottom sweep over time when a positive voltage of +5 V is applied to the first and second gate electrodes, and FIG. 10B shows the electrical properties of the dual sweep over time when a negative voltage of −5 V is applied to the first and second gate electrodes.

FIG. 10C shows threshold voltages over time.

In addition, in FIGS. 10A to 10C, negative gate bias temperature stress (NBTS) conditions in which heat (60° C.) and a voltage of −5 V are applied are used.

In addition, FIGS. 10A and 10B show the electrical properties for the dual sweep of an oxide semiconductor thin film transistor having a channel length of 10 μm.

Referring to FIGS. 10A to 10C, it can be confirmed that the dual sweep has better reliability for PBTS than the bottom sweep.

Although the present invention has been described through limited examples and figures, the present invention is not intended to be limited to the examples. Those skilled in the art will appreciate that various modifications, additions, and substitutions are possible, without departing from the scope and spirit of the invention.

Therefore, the scope of the present invention should not be limited by the embodiments, but should be determined by the following claims and equivalents to the following claims.

DESCRIPTION OF SYMBOLS

102: SUBSTRATE
104: FIRST GATE ELECTRODE
106: FIRST GATE INSULATING FILM
108: SOURCE ELECTRODE
112: DRAIN ELECTRODE
114: OXIDE SEMICONDUCTOR FILM
116: SECOND GATE INSULATING FILM
118, 119: PIXEL ELECTRODES
120: SECOND GATE ELECTRODE
124: OFFSETS

The invention claimed is:

1. An oxide semiconductor transistor, comprising:
a substrate;
a first gate electrode formed on the substrate;
a first gate insulating film formed on the first gate electrode;
a source electrode and a drain electrode separately formed on one surface of the first gate insulating film;
an oxide semiconductor film formed on the first gate insulating film and the source and drain electrodes;
a second gate insulating film formed on the oxide semiconductor film using a solution process;
pixel electrodes separately formed on one surface of the second gate insulating film and electrically connected to the source and drain electrodes, respectively; and
a second gate electrode formed on the second gate insulating film,
wherein electrical properties of the oxide semiconductor transistor are controlled by adjusting a pH of a solution for forming the second gate insulating film comprising yttrium oxide ($Y_2O_3$) with a water ($H_2O$)-based solvent, to reduce a damage to the oxide semiconductor film, the first gate electrode, the source electrode and the drain electrode and by adjusting an offset, which is a non-overlap region, present between the source electrode and the second gate electrode and an offset, which is a non-overlap region, present between the drain electrode and the second gate electrode.

2. The oxide semiconductor transistor according to claim 1, wherein the offset is at least one of width between one end of the second gate electrode and the source electrode and width between the other end of the second gate electrode and the drain electrode.

3. The oxide semiconductor transistor according to claim 1, wherein at least one of the first gate insulating film and the oxide semiconductor film is formed using a solution process.

4. The oxide semiconductor transistor according to claim 1, wherein the first and second gate electrodes are electrically connected to each other to receive identical voltages.

5. The oxide semiconductor transistor according to claim 1, wherein the first gate insulating film comprises at least one of aluminum oxide ($Al_2O_3$), zirconium oxide ($ZrO_x$), zirconium aluminum oxide ($ZrAlO_x$), and hafnium oxide ($HfO_x$).

6. The oxide semiconductor transistor according to claim 1, wherein the oxide semiconductor film comprises at least one of indium gallium zinc oxide (IGZO), indium oxide (InO), zinc oxide (ZnO), indium gallium oxide (IGO), indium aluminum oxide (IAO), indium zinc oxide (IZO), indium tin oxide (ITO), zinc tin oxide (ZTO), gallium zinc oxide (GZO), hafnium indium zinc oxide (HIZO), indium zinc tin oxide (IZTO), and aluminum zinc tin oxide (AZTO).

7. The oxide semiconductor transistor according to claim 1, wherein the oxide semiconductor film is formed to have a channel length of 4 μm or more.

* * * * *